United States Patent
Nishida et al.

(10) Patent No.: US 6,538,537 B2
(45) Date of Patent: Mar. 25, 2003

(54) INTEGRATED CIRCUIT AND RESONANCE CIRCUIT

(75) Inventors: Masao Nishida, Sakai (JP); Tetsuro Sawai, Ashiya (JP)

(73) Assignee: Sanyo Electric Co. Ltd., Moriguchi (JP)

(*) Notice: Subject to any disclaimer, the term of this patent is extended or adjusted under 35 U.S.C. 154(b) by 0 days.

(21) Appl. No.: 10/131,482

(22) Filed: Apr. 25, 2002

(65) Prior Publication Data

US 2002/0113672 A1 Aug. 22, 2002

Related U.S. Application Data

(62) Division of application No. 09/738,757, filed on Dec. 18, 2000, now Pat. No. 6,400,240, which is a division of application No. 09/089,540, filed on Jun. 3, 1998, now Pat. No. 6,211,754.

(30) Foreign Application Priority Data

Jun. 4, 1997 (JP) .............................................. 9-146270

(51) Int. Cl.$^7$ ........................... H01P 7/00; H03H 11/28; H03F 1/38
(52) U.S. Cl. ........................ 333/245; 333/246; 330/291
(58) Field of Search ................................. 333/246, 245; 330/286, 296, 294, 260, 271, 282, 83

(56) References Cited

U.S. PATENT DOCUMENTS

| 4,749,963 A | 6/1988 | Makimoto et al. ...... 333/246 X |
|---|---|---|
| 5,105,172 A | 4/1992 | Khatibzadeh et al. ........ 333/175 |
| 5,233,310 A | 8/1993 | Inoue ......................... 330/277 |
| 5,406,238 A | 4/1995 | Suzuki .................... 333/235 X |
| 5,506,553 A | 4/1996 | Makita et al. .............. 333/204 |
| 5,576,667 A | 11/1996 | Goma .................... 331/117 D |
| 5,708,397 A | 1/1998 | Furutani et al. .......... 331/96 X |

FOREIGN PATENT DOCUMENTS

| JP | 62-292002 | 12/1987 |
| SU | 1753516 | 8/1992 |

OTHER PUBLICATIONS

Makioka et al., "A miniaturized GaAs Power Amplifier for 1.5 GHz Digital Phones", IEEE 1996 Microwave & Milli.–Wave Monolithic Circuits symp., pp. 3–16.

Pozar, Microwave Engineering, Addison–Wesley Publishing Company, pp. 330–335, Sep. 1993.

Primary Examiner—Benny Lee
Assistant Examiner—Stephen E. Jones
(74) Attorney, Agent, or Firm—Armstrong Westerman & Hattori, LLP

(57) ABSTRACT

A chip capacitor is arranged on a microstrip conductor forming a microstrip line. The chip capacitor has a dielectric material and electrodes provided on both ends thereof. The electrodes of the chip capacitor are connected to the microstrip conductor. A resonance frequency is decided by the length of the microstrip conductor between the electrodes of the chip capacitor, the dielectric constant and the thickness of the dielectric substrate and the capacitance value of the chip capacitor.

1 Claim, 16 Drawing Sheets

INTEGRATED CIRCUIT AND RESONANCE CIRCUIT

This application is a division of prior application Ser. No. 09/738,757 filed Dec. 18, 2000, now U.S. Pat. No. 6,420,240 which is a division of grandparent application Ser. No. 09/089,540, filed Jun. 3, 1998, now U.S. Pat. No. 6,211,754, issued Apr. 3, 2001.

BACKGROUND OF THE INVENTION

1. Field of the Invention

The present invention relates to an integrated circuit and a resonance circuit.

2. Description of the Prior Art

Following rapid development of mobile communication, radio waves of an extremely wide range of frequencies are required in recent years, and the frequencies of the radio waves employed for mobile communication are now shifting to the microwave, band. Therefore, an amplifier employed for a portable terminal is formed by a monolithic microwave integrated circuit (MMIC) or a modularized microwave integrated circuit (MIC).

An amplifier for amplifying a signal of a desired frequency employs a bias circuit for applying a prescribed dc bias to the gate or the drain of a field-effect transistor (FET). The amplifier is further provided with a feedback circuit for preventing the FET from oscillating in a low-frequency domain and improving the stability of the amplifier.

FIG. 23 is a circuit diagram showing an exemplary conventional bias circuit-which is provided on an amplifier formed by an FET 200.

The bias circuit shown in FIG. 23 comprises a parallel resonance circuit 300 formed by an inductor L1 and a capacitor C1, which are connected in parallel with each other. This parallel resonance circuit 300 can apply a dc drain bias Vd to the drain of the FET 200 from a bias supply by adjusting the inductance value of the inductor L1 and the capacitance value of the capacitor C1, without passing a signal of a desired frequency.

When the amplifier is employed in the 1.5 GHz band, for example, the parallel resonance circuit 300 can apply the drain bias Vd to the drain of the FET 200 with no signal loss at the frequency of 1.5 GHz by setting the inductance value of the inductor L1 and the capacitance value of the capacitor C1 at 0.4 nH and 28 pF respectively.

FIG. 24 is a circuit diagram showing another exemplary bias circuit provided on an amplifier which is formed by an FET 200.

The bias circuit shown in FIG. 24 is formed by a microstrip line MSL. This microstrip line MSL can apply a dc drain bias Vd to the drain of the FET 200 by setting its length at ¼ the wavelength corresponding to a desired frequency, without passing a signal of the frequency.

FIG. 25 is a circuit diagram showing an exemplary conventional feedback circuit provided on an amplifier which is formed by an FET 200.

The feedback circuit shown in FIG. 25 is formed by a capacitor C2 and a resistor R1, which are serially connected between the drain and the gate of the FET 200. This feedback circuit feeds back a part of a high-frequency signal appearing on the drain of the FET 200 to the gate in a negative phase. Thus, the feedback circuit suppresses the gain mainly at a low frequency and prevents the FET 200 from oscillation. The capacitor C2 is so provided as to feed back no dc component to the gate of the FET 200.

The bias circuit shown in FIG. 23 formed by the parallel resonance circuit 300 requires at least two types of elements, i.e., the inductor L1 and the capacitor C1. When the amplifier is designed, therefore, a space for mounting the inductor L1 and the capacitor C1 must be provided on a substrate.

Particularly in case of an MMIC operating in a high-frequency region, a spiral inductor having a large occupied area is employed as the inductor L1. Therefore, the area of the parallel resonance circuit formed on a dielectric substrate is extremely increased.

On the other hand, a modularized MIC requires external parts called a chip capacitor and a chip inductor as the capacitor C1 and the inductor L1 respectively. In this case, it is necessary to consider a method of adjacently mounting the chip capacitor and the chip inductor in the vicinity of each other. Thus, the bias circuit occupies an extremely large area on a substrate, and exerts bad influence on the characteristics of the modularized MIC. Further, the chip inductor is considerably high-priced as compared with the chip capacitor.

In addition, a wire having a finite length is present for connecting the drain of the FET 200 with the bias supply. This wire is formed by a microstrip line on a dielectric substrate. Thus, the calculative resonance frequency of the parallel resonance circuit 300 deviates from the actual one due to the presence of the microstrip line. Therefore, the parallel resonance circuit 300 must be designed in consideration of the microstrip line.

In the bias circuit formed by the microstrip line MSL shown in FIG. 24, the length of the microstrip line MSL is disadvantageously increased. Assuming that a dielectric substrate has a thickness of 0.8 mm and a dielectric constant of 9 in case of employing the bias circuit at a frequency of 1.5 GHz, for example, the length equal to ¼ the wavelength is about 20 mm.

The feedback circuit shown in FIG. 25 formed by the resistor R1 and the capacitor C2 requires at least two types of elements. If the resistance value of the resistor R1 is reduced in order to improve stability in this feedback circuit, the feedback amount is increased to disadvantageously reduce the gain. If the resistance value of the resistor R1 is increased, on the other hand, the feedback effect is reduced and the stability cannot be improved.

To this end, the feedback circuit may be provided with a parallel resonance circuit formed by an inductor and a capacitor, to be capable of feeding back only a signal of a frequency other than the desired frequency. Thus, reduction of the gain can be suppressed with respect to the signal of the desired frequency while reducing the resistance value of the resistor R1.

However, such provision of the parallel resonance circuit formed by the inductor and the capacitor results in a problem absolutely similar to that in the bias circuit shown in FIG. 23, and allows no miniaturization. Further, a wire having a finite length is necessarily present, in order to connect the drain and the gate of the FET 200. This wire is formed by a microstrip line on a dielectric substrate as hereinabove described, and hence the calculative resonance frequency of the parallel resonance circuit disadvantageously deviates from the actual one.

SUMMARY OF THE INVENTION

An object of the present invention is to provide an integrated circuit allowing miniaturization and having excellent characteristics, which can be fabricated with a small number of elements through simple steps.

Another object of the present invention is to provide a resonance circuit allowing miniaturization and having excellent characteristics, which can be fabricated with a small number of elements through simple steps, and a bias circuit, a feedback circuit, a high-frequency signal processing circuit, a matching circuit and a stub comprising the same.

An integrated circuit according to an aspect of the present invention comprises a dielectric substrate, a microstrip line which is provided on the dielectric substrate, and a capacitor which is arranged on the microstrip line and connected to this microstrip line.

The microstrip line is inductive or capacitive, depending on the relation between its length and a frequency. In the integrated circuit according to the present invention, therefore, the length of the microstrip line is set so that the microstrip line is inductive at a specific frequency, thereby forming a parallel circuit of an inductance and a capacitance.

In this case, the parallel circuit of the inductance and the capacitance can be formed in a small occupied area with a small number of elements through simple steps, since the capacitor is arranged on the microstrip line.

The microstrip line may include a microstrip conductor and a grounding conductor which are formed on the front and back surfaces of the dielectric substrate respectively, and the capacitor may include a dielectric material which is arranged on the microstrip conductor and a pair of electrodes which are provided on both ends of the dielectric material along the longitudinal direction of the microstrip conductor, so that the pair of electrodes are connected to the microstrip conductor: respectively.

In this case, the resonance frequency of the parallel circuit is univocally set by the length of the microstrip conductor between the pair of electrodes of the capacitor, the dielectric constant and the thickness of the dielectric substrate and the capacitance value of the capacitor. Therefore, the resonance frequency can be readily matched with a desired frequency.

Alternatively, the microstrip line may include a microstrip conductor and a grounding conductor which are formed on the front and back surfaces of the dielectric substrate respectively, and the capacitor may include an insulator layer which is formed on the microstrip conductor and a metal layer which is formed on the insulator layer, so that an end of the metal layer along the longitudinal direction of the microstrip conductor is connected to the microstrip conductor.

In this case, the resonance frequency of the parallel circuit is univocally decided by the length of the microstrip conductor located under the metal layer, the dielectric constant and the thickness of the dielectric substrate and the capacitance value of the capacitor. Therefore, the resonance frequency can be readily matched with a desired frequency.

In particular, the capacitance value of the capacitor, which can be set by adjusting the thickness of the insulator layer, is hardly limited by any dimension.

A resonance circuit according to another aspect of the present invention comprises a dielectric substrate, a microstrip line which is provided on the dielectric substrate, and a capacitor which is arranged on the microstrip line and connected with this microstrip line.

The resonance circuit can resonate at a specific frequency by setting the length of the microstrip line so that the microstrip line is inductive at the specific frequency.

In this case, the resonance frequency, which is univocally decided by the capacitance value of the capacitor and the characteristics of the microstrip line, can be readily matched with a desired frequency. Thus, excellent characteristics can be readily implemented.

Further, the capacitor is arranged on the microstrip line, whereby the resonance circuit can be fabricated in a small occupied area with a small number of elements through simple steps.

The microstrip line may include a microstrip conductor and a grounding conductor which are formed on the front and back surfaces of the dielectric substrate respectively, and the capacitor may include a dielectric material which is arranged on the microstrip conductor and a pair of electrodes which are provided on both ends of the dielectric material along the longitudinal direction of the microstrip conductor, so that the pair of electrodes are connected to the microstrip conductor respectively.

In this case, the resonance frequency is univocally decided by the length of the microstrip conductor between the pair of electrodes of the capacitor, the dielectric constant and the thickness of the dielectric substrate and the capacitance value of the capacitor. Therefore, the resonance frequency can be readily matched with the desired frequency.

The length between the pair of electrodes of the capacitor which are connected to the microstrip conductor may be set so that the microstrip line is inductive with respect to the specific frequency.

In this case, the microstrip line is inductive with respect to the specific frequency, whereby the resonance circuit can resonate at the desired frequency by adjusting the capacitance value of the capacitor.

The capacitance value of the capacitor may be so set as to cause resonance at the aforementioned specific frequency. Thus, the resonance circuit can resonate at the desired frequency.

Alternatively, the microstrip line may include a microstrip conductor and a grounding conductor which are formed on the front and back surfaces of the dielectric substrate respectively, and the capacitor may include an insulator layer which is formed on the microstrip conductor and a metal layer which is formed on the insulator layer so that an end of the metal layer along the longitudinal direction of the microstrip conductor is connected to the microstrip conductor.

In this case, the resonance frequency is univocally decided by the length of the microstrip conductor located under the metal layer, the dielectric constant and the thickness of the dielectric substrate and the capacitance value of the capacitor. Therefore, the resonance frequency can be readily matched with the desired frequency.

In particular, the capacitance value of the capacitor, which can be set by adjusting the thickness of the insulator layer, is hardly limited by any dimension.

The length of the metal layer along the longitudinal direction of the microstrip conductor may be set so that the microstrip line is inductive with respect to the specific frequency.

In this case, the microstrip line is inductive with respect to the specific frequency, whereby the resonance circuit can resonate at the desired frequency by setting the capacitance value of the capacitor.

The capacitance value of the capacitor may be so set as to cause resonance at the aforementioned specific frequency. Thus, the resonance circuit can resonate at the desired frequency.

A bias circuit for applying a bias to an electrode of a transistor according to still another aspect of the present invention comprises a dielectric substrate, a microstrip line which is provided on the dielectric substrate and connected to the electrode of the transistor, and a capacitor which is arranged on the microstrip line and connected to the microstrip line, to apply the bias to a part of the microstrip line which is opposite to the transistor in relation to the capacitor.

In this case, a resonance circuit formed by the microstrip line and the capacitor can open at a prescribed frequency by setting the capacitance value of the capacitor to cause resonance at the prescribed frequency. Thus, the bias circuit can apply the bias to the electrode of the transistor through the microstrip line without influencing a signal of the prescribed frequency on the electrode of the transistor.

An electrode of the capacitor closer to the transistor is connected to a position excluding that separating from the electrode of the transistor by a distance equal to ¼ the wavelength corresponding to the prescribed frequency on the microstrip line. Thus, the electrode of the transistor is not shorted with respect to the prescribed frequency.

A bias circuit for applying a bias to an electrode of a transistor according to a further aspect of the present invention comprises a dielectric substrate, a microstrip line which is provided on the dielectric substrate and connected to the electrode of the transistor, and a capacitor which is arranged on the microstrip line and connected to this microstrip line. An electrode of the capacitor which is opposite to the transistor is grounded in a high-frequency manner, so that the bias is applied to a part of the microstrip line which is opposite to the transistor in relation to the capacitor.

In this case, a resonance circuit formed by the microstrip line and the capacitor can be set at a prescribed impedance by setting the capacitance value of the capacitor to cause resonance at a prescribed frequency. Thus, the bias circuit can apply the bias to the electrode of the transistor through the microstrip line without influencing a signal of the prescribed frequency on the electrode of the transistor.

The electrode of the capacitor which is opposite to the transistor may be grounded through a bypass capacitor. Thus, the electrode of the capacitor which is opposite to the transistor is grounded in an ac manner.

A feedback circuit, which is provided between output and input-side electrodes of a transistor, according to a further aspect of the present invention comprises a dielectric substrate, a microstrip line which is provided on the dielectric substrate for feeding back a signal on the output-side electrode of the transistor to the input-side electrode, and a capacitor which is arranged on the microstrip line and connected to this microstrip line.

In this feedback circuit, a signal of a specific frequency among those outputted from the output-side electrode of the transistor is blocked by a resonance circuit which is formed by the microstrip line and the capacitor not to be fed back to the input-side electrode, while the remaining signal of another frequency is fed back to the input-side electrode. Thus, the-stability.of the transistor is improved.

A high-frequency signal processing circuit, which is connected to a prescribed node for suppressing a specific frequency signal, according to a further aspect of the present invention comprises a dielectric substrate, a microstrip line which is provided on the dielectric substrate and connected to the prescribed node, and a capacitor which is arranged on the microstrip line and connected to this microstrip line, and an electrode of the capacitor which is opposite to the prescribed node is grounded in a high-frequency manner. The capacitance value of the capacitor is so set as to cause resonance at the specific frequency. Thus, the high-frequency signal processing circuit suppresses the specific frequency signal.

A matching circuit, which is connected to a prescribed circuit, according to a further aspect of the present invention comprises a dielectric substrate, a microstrip line which is provided on the dielectric substrate and connected to the prescribed circuit, and a capacitor which is arranged on the microstrip line and connected to this microstrip line.

This matching circuit can attain impedance matching with the prescribed circuit by adjusting the position of the capacitor which is arranged on the microstrip line.

A stub, which extends from a prescribed line to open with respect to a specific frequency, according to a further aspect of the present invention comprises a dielectric substrate, a microstrip line which is provided on the dielectric substrate and extends from the prescribed line, and a capacitor which is arranged on the microstrip line and connected to this microstrip line. The capacitance value of the capacitor is set to cause resonance at the specific frequency. Thus, a resonance circuit which is formed by the microstrip line and the capacitor opens at the specific frequency.

A stub, which extends from a prescribed line and terminates the prescribed line at a prescribed impedance with respect to a specific frequency, according to a further aspect of the present invention comprises a dielectric substrate, a microstrip line which is provided on the dielectric substrate and extends from the prescribed line, and a capacitor which is arranged on the microstrip line and connected to this microstrip line, and an electrode of the capacitor which is opposite to the prescribed line is grounded in a high-frequency manner. The capacitance value of the capacitor is set to cause resonance at the specific frequency. Thus, a resonance circuit which is formed by the microstrip line and the capacitor is at a prescribed impedance with respect to the specific frequency.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
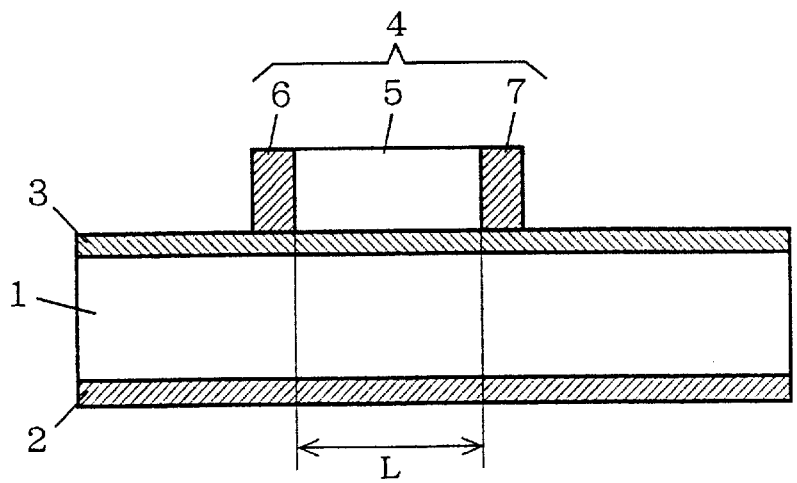
FIG. 1 is a typical sectional view showing a resonance circuit according to a first embodiment of the present invention.
Figure 2:
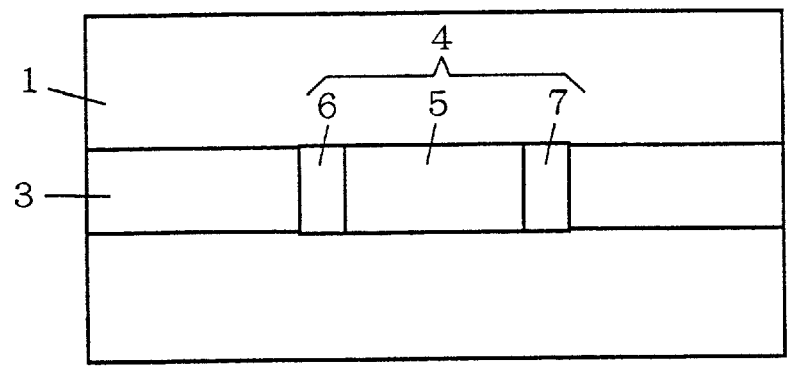
FIG. 2 is a plan view of the resonance circuit shown in FIG. 1.
Figure 3:
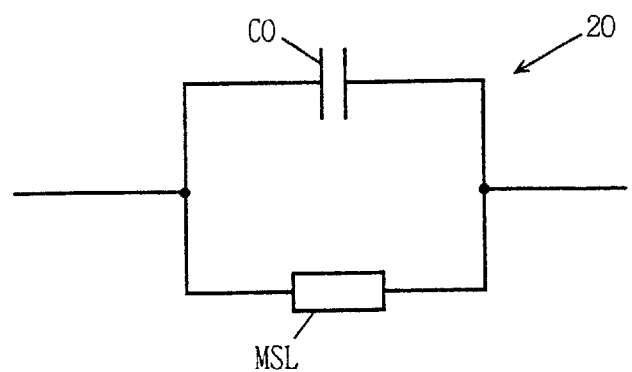
FIG. 3 is an equivalent circuit diagram of the resonance circuit shown in FIG. 1.

FIG. 1 is a typical sectional view showing a resonance circuit according to a first embodiment of the present invention, FIG. 2 is a plan view of the resonance circuit shown in FIG. 1, and FIG. 3 is an equivalent circuit diagram of the resonance circuit shown in FIG. 1.

As shown in FIGS. 1 and 2, a grounding conductor 2 and a microstrip conductor 3 are formed on the rear and upper surfaces of a dielectric substrate 1 which is made of GaAs or the like respectively. The microstrip conductor 3, the dielectric substrate 1 and the grounding conductor 2 form a microstrip line.

A chip capacitor 4 is mounted on the microstrip conductor 3. This chip capacitor 4 is formed by a dielectric material 5 and electrodes 6 and 7 which are provided on both ends thereof.

In this case, the portion between the electrodes 6 and 7 of the chip capacitor 4 is equivalently expressed by parallel connection of a capacitor C0 and a microstrip line MSL, as shown in FIG. 3.

The microstrip line MSL is inductive equivalently to an inductor or capacitive equivalently to a capacitor, depending on the relation between its length and a frequency. Therefore, a resonance circuit 20 can be formed by setting the length L of the microstrip line MSL between the electrodes 6 and 7 of the chip capacitor 4 so that the microstrip line MSL is inductive at a specific frequency.

In this case, the microstrip-line MSL is inductive if its length is short, whereby the resonance circuit 20 can be readily formed.

Further the resonance frequency of the resonance circuit 20, which is univocally decided by the capacitance value of the capacitor C0 and the characteristics (the length L of the microstrip line MSL and the dielectric constant and the thickness of the dielectric substrate 1) of the microstrip line MSL, can be readily matched with a desired frequency.

Thus, the resonance circuit 20 according to the first embodiment of the present invention, which is formed by superposing the chip capacitor 4 on the microstrip conductor 3, requires no inductor. Therefore, the circuit structure is extremely simplified, the number of elements and the occupied area are reduced, and fabrication steps are also simplified.

Figure 4:
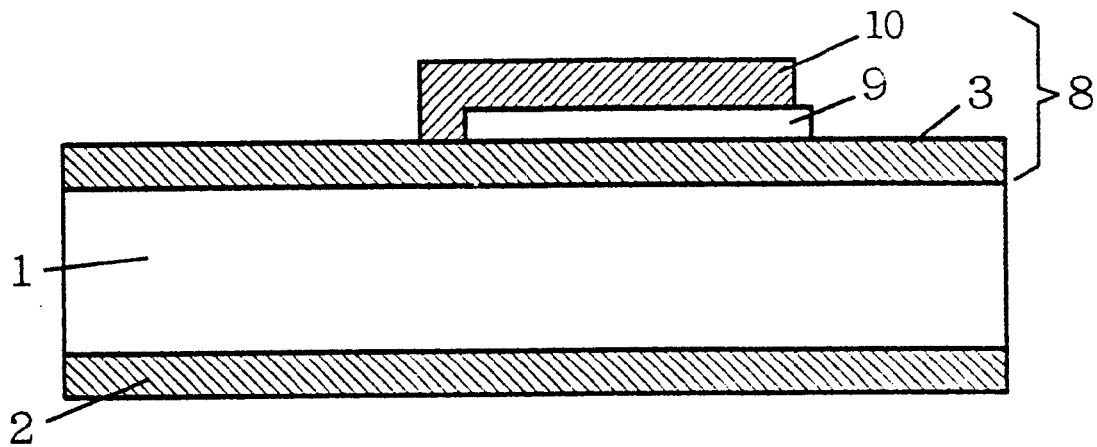
FIG. 4 is a typical sectional view showing a resonance circuit according to a second embodiment of the present invention.
Figure 5:
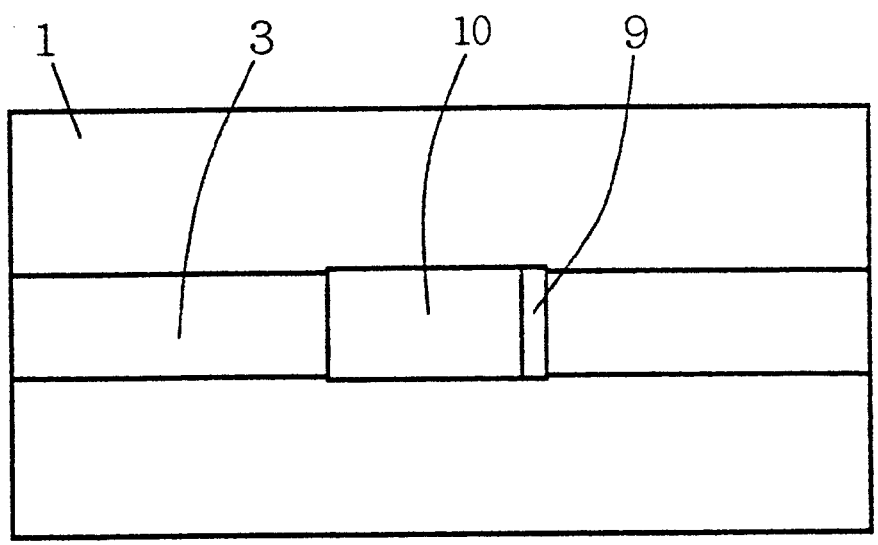
FIG. 5 is a plan view of the resonance circuit shown in FIG. 4.

FIG. 4 is a typical sectional view showing a resonance circuit according to a second embodiment of the present invention, and FIG. 5 is a plan view of the resonance circuit shown in FIG. 4.

As shown in FIGS. 4 and 5, a grounding conductor 2 and a microstrip conductor 3 are formed on the rear and front surfaces of a dielectric substrate 1 which is made of GaAs or the like respectively. The microstrip conductor 3, the dielectric substrate 1 and the grounding conductor 2 form a microstrip line.

An MIM (metal-insulator-metal) capacitor 8 is formed on the microstrip conductor 3. The MIM capacitor 8 includes an insulator layer 9 and a metal layer 10 which are stacked on the microstrip conductor 3. Namely, the MIM capacitor 8 is formed by the metal layer 10, the insulator layer 9 and the microstrip conductor 3 located under the insulator layer 9.

Thus, the resonance circuit according to the second embodiment of the present invention, which is formed by superposing the MIM capacitor 8 on the microstrip conductor 3, requires no inductor. Therefore, the circuit structure is extremely simplified, the number of elements and the occupied area are reduced, and fabrication steps are also simplified.

In this case, the capacitance value of the MIM capacitor 8, which can be set at an arbitrary value by adjusting the thickness of the insulator 9, is hardly limited by any dimension.

Figure 6:
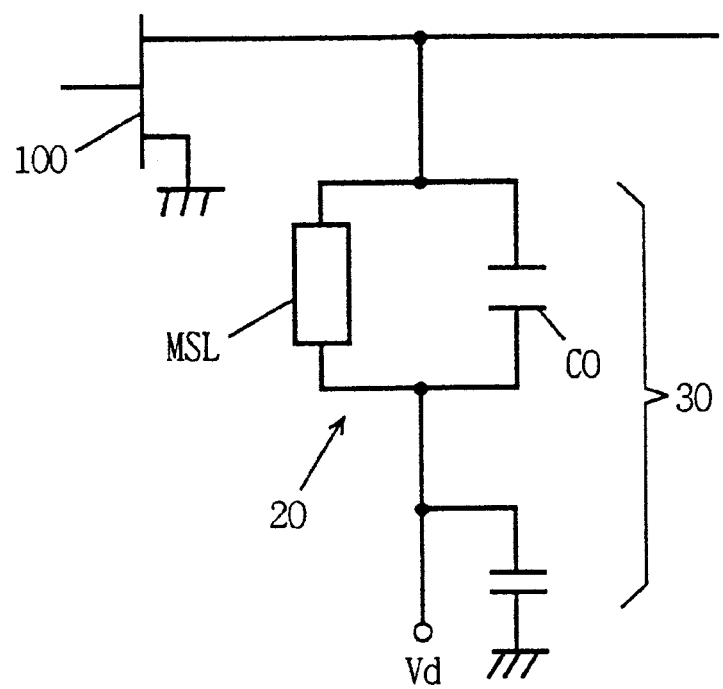
FIG. 6 is a circuit diagram of a bias circuit employing the resonance circuit according to the first or second embodiment of the present invention.

FIG. 6 is a circuit diagram of a bias circuit 30 employing the resonance circuit 20 according to the first or second embodiment of the present invention. Referring to FIG. 6, the bias circuit 30 formed by the resonance circuit 20 according to the first or second embodiment of the present invention is connected to the drain of an FET 100.

This bias circuit 30, which is readily prepared by superposing a capacitor C0 formed by the chip capacitor 4 or the MIM capacitor 8 on the microstrip line MSL employed as a wire, requires no additional area.

In this case, the resonance frequency can be readily matched with a desired frequency (fundamental frequency) by setting the capacitance value of the capacitor C0 and the characteristics of the microstrip line MSL, with no regard to the inductance value of the wire formed by the microstrip line MSL.

Assuming that the thickness and the dielectric constant of the dielectric substrate 1 are 0.8 mm and 9 respectively and the length L of the chip capacitor 4 is 1 mm in case of employing the resonance circuit 20 according to the first embodiment of the present invention, for example, the capacitance value necessary for causing resonance at a frequency of 1.5 GHz is 46 pF. Thus, the bias circuit 30 can be formed in a length of about 1 mm by arranging the chip capacitor 4 having the capacitance value of 46 pF in the vicinity of the drain of the FET 100, thereby attaining miniaturization.

Figure 24:
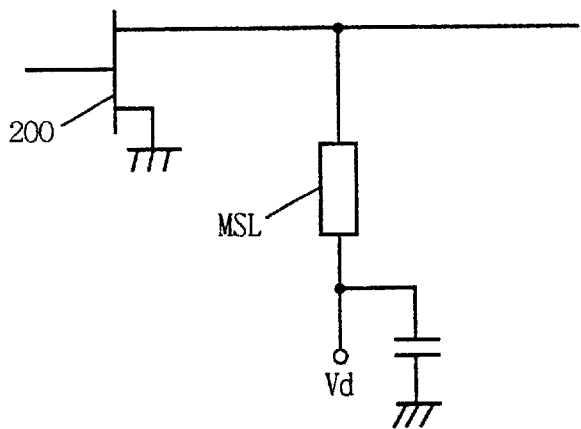
FIG. 24 is a circuit diagram showing another exemplary conventional bias circuit.
Figure 25:
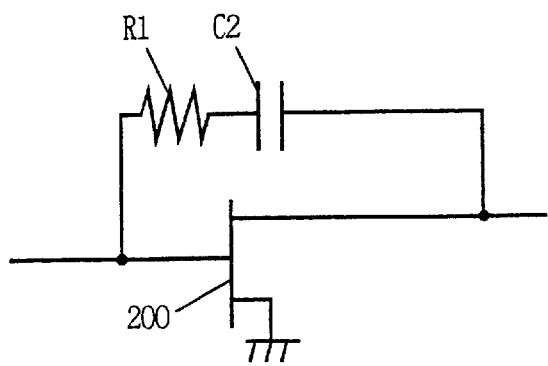
FIG. 25 is a circuit diagram showing an exemplary conventional feedback circuit.

In the bias circuit formed by the microstrip line MSL shown in FIG. 24, on the other hand, the microstrip line MSL requires a length of about 20 mm when employed at the frequency of 1.5 GHz, as hereinabove described.

Figure 7:
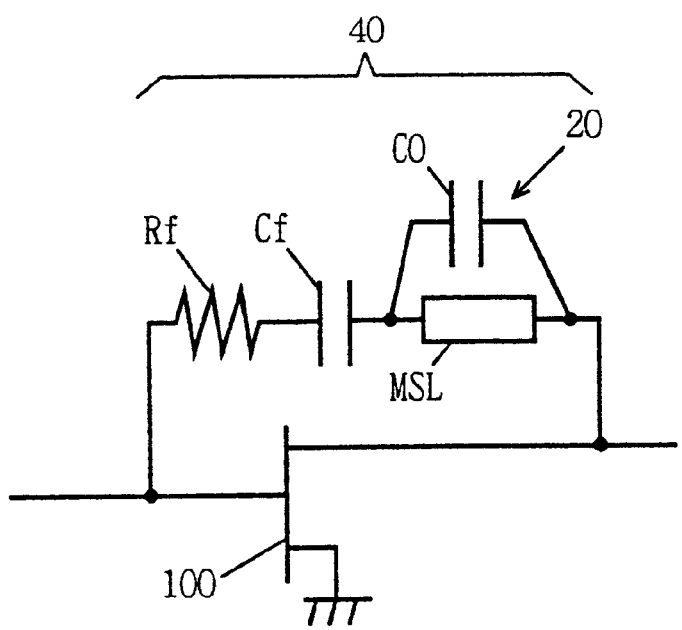
FIG. 7 is a circuit diagram of a feedback circuit employing the resonance circuit according to the first or second embodiment of the present invention.

FIG. 7 is a circuit diagram of a feedback circuit 40 employing the resonance circuit 20 according to the first or second embodiment of the present invention. Referring to FIG. 7, the feedback circuit 40 is connected between the drain and the gate of an FET 100. In this feedback circuit 40, a resistor Rf, a capacitor Cf and the resonance circuit 20 are serially connected with each other.

This feedback circuit 40, which can be readily formed by superposing the chip capacitor 4 or the MIM capacitor 8 on the microstrip line MSL employed as a wire, requires no additional area.

In this feedback circuit 40, the resonance circuit 20 blocks a signal of a desired frequency (signal frequency) among those outputted from the drain of the FET 100 not to feed back this signal to the gate of the FET, while feeding back the remaining signal of another frequency, such as an instable signal of a low frequency, for example. Thus, the stability of an amplifier is improved. Further, the resistance value of the resistor Rf can be reduced, in order to further improve the stability of the amplifier.

Figure 8:
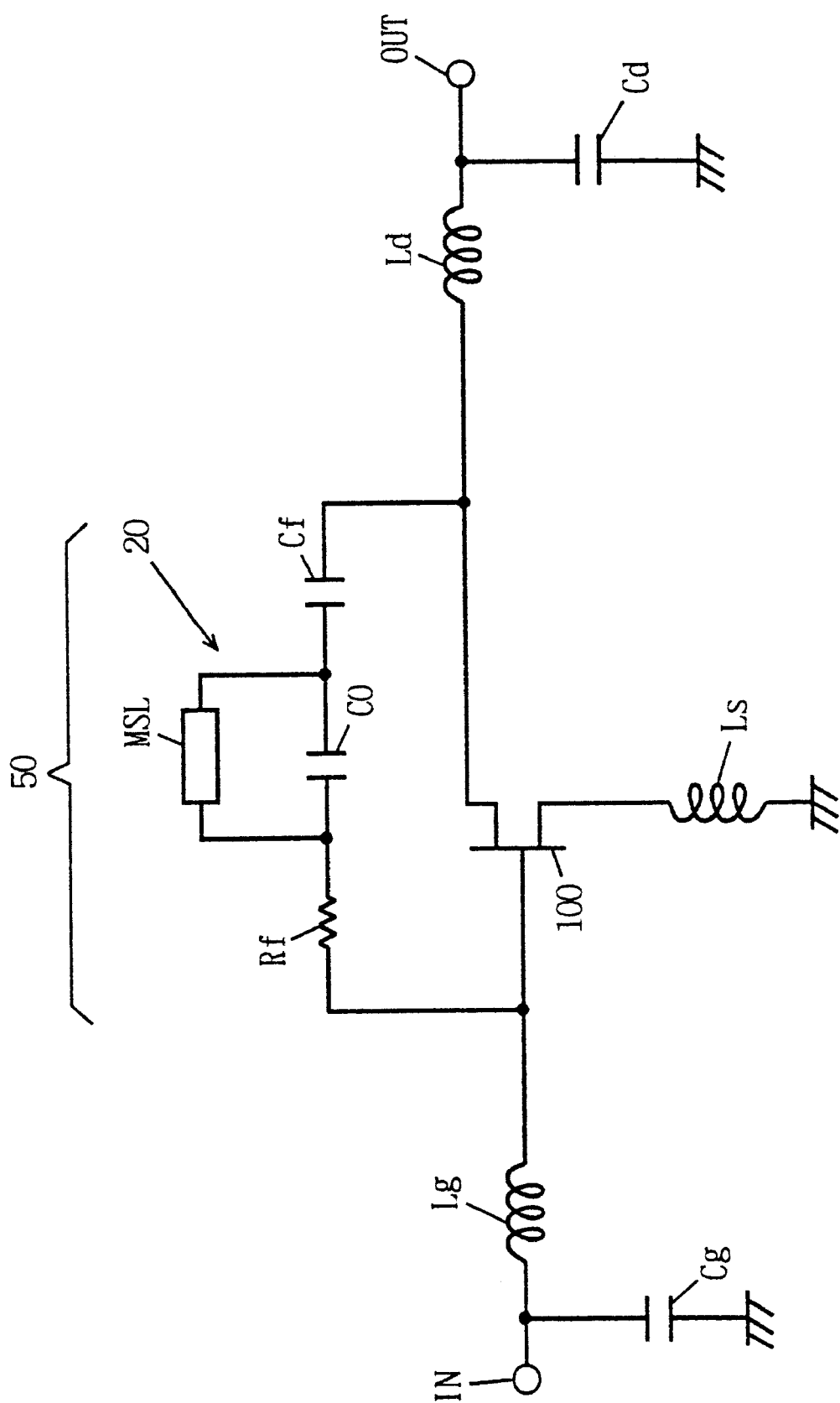
FIG. 8 is a circuit diagram showing an exemplary amplifier employing the feedback circuit formed by the resonance circuit according to the first or second embodiment of the present invention.

FIG. 8 is a circuit diagram showing an exemplary amplifier employing a feedback circuit 50 formed by the resonance circuit 20 according to the first or second embodiment of the present invention.

The amplifier shown in FIG. 8, which includes an FET 100, capacitors Cg, Cd, Cf and C0, inductors Lg, Ls and Ld, a resistor Rf and a microstrip line MSL, is formed on a dielectric substrate.

An input terminal IN is grounded through the capacitor Cg and connected to the gate of the FET 100 through the inductor Lg. The source of the FET 100 is grounded through the inductor Ls. The drain of the FET 100 is connected to an output terminal OUT through the inductor Ld. The output terminal OUT is grounded through the capacitor Cd. The capacitor Cg, the inductors Lg, Ls and Ld and the capacitor Cd serve as an impedance matching circuit.

The feedback circuit 50 is connected between the drain and the gate of the FET 100. The feedback circuit 50 is formed by the resistor Rf, the resonance circuit 20 and the capacitor Cf which are connected in series with each other. The resonance circuit 20 is formed by the microstrip line MSL and the capacitor C0 which are connected in parallel with each other.

The capacitors Cg and Cd and the inductors Lg and Ld are formed by chip components, and the inductor Ls is formed by a bonding wire. The capacitor Cf is formed by a chip capacitor, and the resistor Rf is formed by a chip resistor.

FIG. 8 omits wires (microstrip lines) provided between the gate of the FET 100 and the inductor Lg and between the drain of the FET 100 and the inductor Ld.

Frequency dependence of S parameters, i.e., gains $S_{21}$, and stability factors K as well as input/output power characteristics were calculated as to amplifiers according to Example and comparative examples 1 and 2. The amplifiers are absolutely stable when K>1.

The amplifier according to Example has the circuit structure shown in FIG. 8, and the capacitance value of the capacitor Cg is 2 pF, the inductance of the inductor Lg is 4 nH, the capacitance value of the capacitor Cd is 3 pF, the inductance of the inductor Ld is 2 nH, and the inductance of the inductor Ls is 0.1 nH. In the feedback circuit 50, the capacitance value of the capacitor Cf is 300 pH, and the resistance value of the resistor Rf is 200 Ω. The capacitance value of the capacitor C0 in the resonance circuit 20 is 46 pF.

The FET 100 is formed by an MESFET (metal-semiconductor field-effect transistor), which is made of GaAs, having a gate length of 0.7 μm and a gate width of 280 μm. The dielectric substrate is formed by an alumina substrate having a dielectric constant of 10, a thickness of 0.8 mm and a dielectric dissipation factor tanδ of $1 \times 10^{-3}$.

The amplifier according to comparative example 1 has a circuit structure similar to that shown in FIG. 8 except that no feedback circuit 50 is provided, and the values of elements forming this amplifier are similar to those in the amplifier according to Example. The amplifier according to comparative example 2 also has a circuit structure similar to that shown in FIG. 8 except that no resonance circuit 20 is provided, and the values of elements forming this amplifier are also similar to those in the amplifier according to Example. In other words, the amplifier according to comparative example 2 has an RC feedback circuit which is formed by only a resistor Rf and a capacitor Cf.

Gains $S_{21}$ and stability factors K at frequencies of 0.1 GHz to 3 GHz were calculated as to the amplifiers according to Example and comparative examples 1 and 2. Further, input/output power characteristics at a frequency of 1.5 GHz were also calculated.

As to bias conditions applied to each FET 100, the drain voltage was 3 V, and the gate voltage was −0.3 V.

Figure 9:
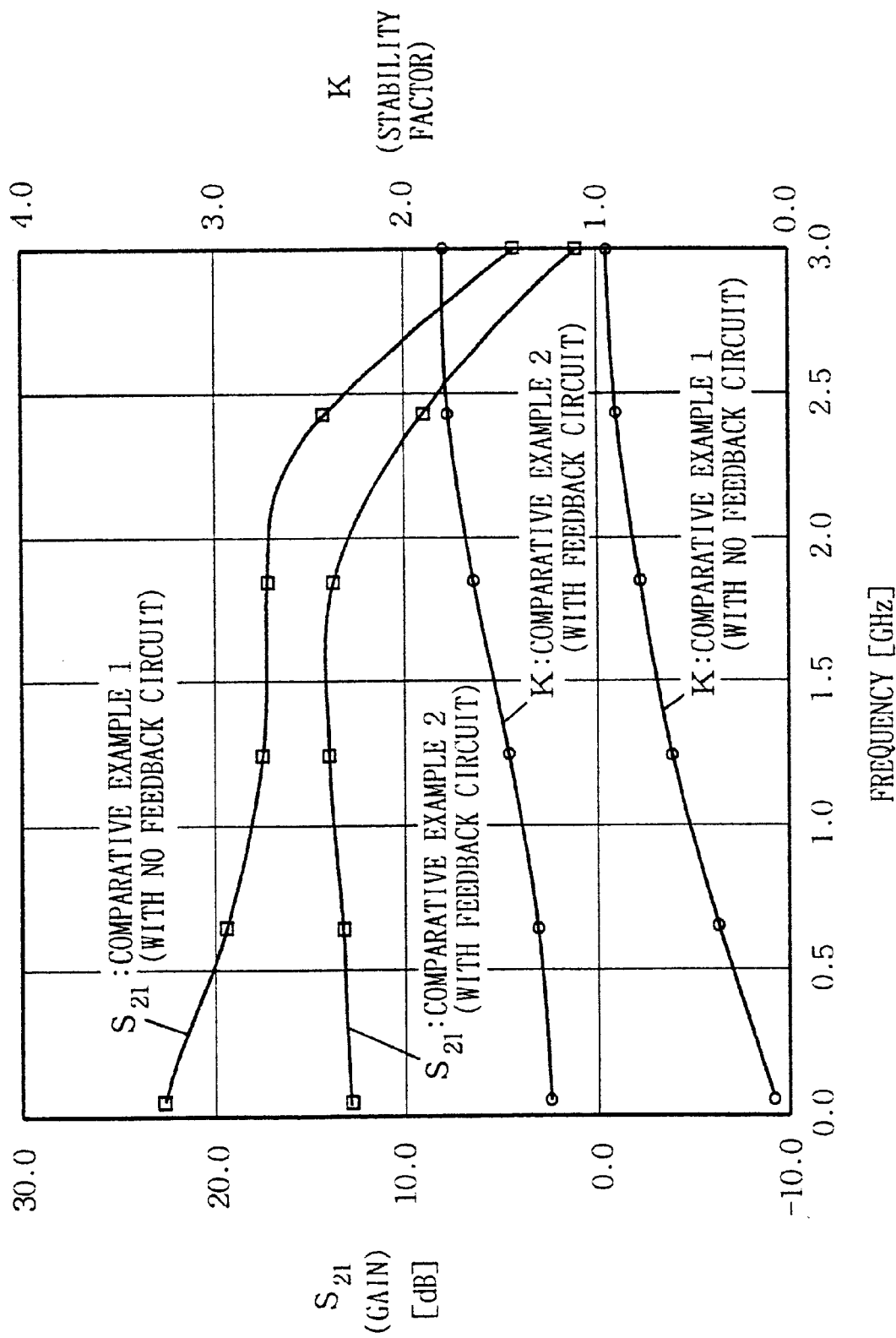
FIG. 9 shows calculation results of frequency dependence of gains $S_{21}$ and stability factors K as to amplifiers according to comparative examples 1 and 2.

FIG. 9 shows the calculation results of the frequency dependence of the gains $S_{21}$ and the stability factors K with respect to the amplifiers according to comparative examples 1 and 2. As shown in FIG. 9, the amplifier according to comparative example 2 having the RC feedback circuit was absolutely stable with the stability factor K exceeding 1 at all frequencies, while its gain $S_{21}$ was lower than that of the amplifier according to comparative example 1 having no feedback circuit at ;all frequencies. In the amplifier according to comparative example 2, the gain $S_{21}$ was deteriorated by 3 dB particularly at the frequency of 1.5 GHz as compared with the amplifier according to comparative example 1. Such deterioration of the gain of the amplifier by 3 dB results in a significant problem.

Figure 10:
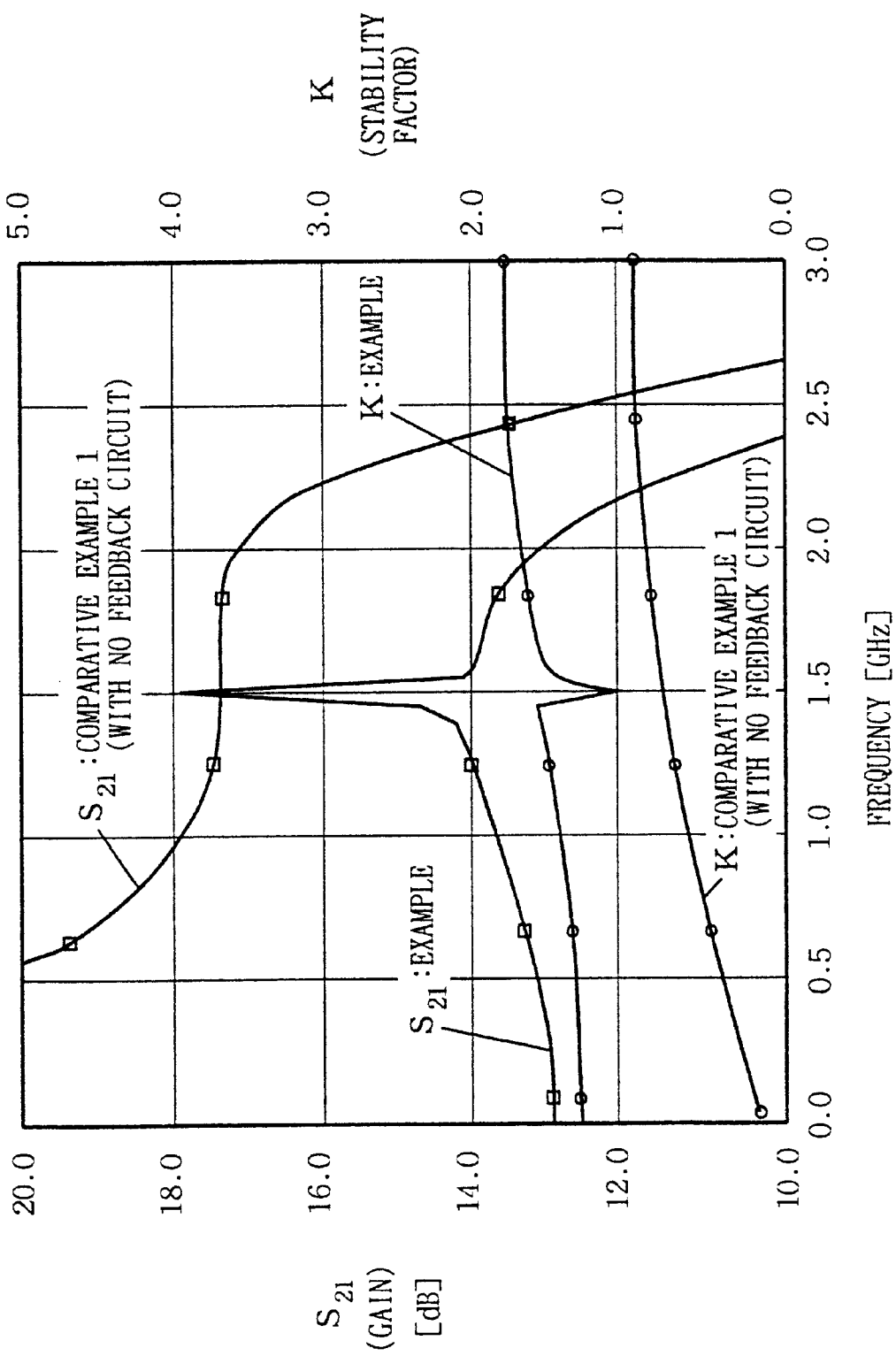
FIG. 10 shows calculation results of frequency dependence of gains $S_{21}$ and stability factors K as to amplifiers according to Example and comparative example 1.

FIG. 10 shows the calculation results of the frequency dependence of the gains $S_{21}$ and the stability factors K with respect to the amplifiers according to Example and comparative example 1. As shown in FIG. 10, the amplifier according to Example having the feedback circuit 50 was absolutely stable with the stability factor K exceeding 1 in the frequency region excluding the frequencies of 1.4 to 1.6 GHz, while the gain $S_{21}$ was lower by 3 to 10 dB than that of the amplifier according to comparative example 1. In the amplifier according to Example, however, the stability factor K was in excess of 1 and the gain $S_{21}$ was improved as compared with the amplifier according to comparative example 1 at the frequencies of 1.4 to 1.6 GHz. Particularly at the frequency of 1.5 GHz, the gain $S_{21}$ of the-amplifier according to Example was higher by 0.5 dB as compared with the amplifier according to comparative example 1. Thus, it is understood that the stability and the gain at the frequency of 1.5 GHz were remarkably improved in the amplifier according to Example.

Figure 11:
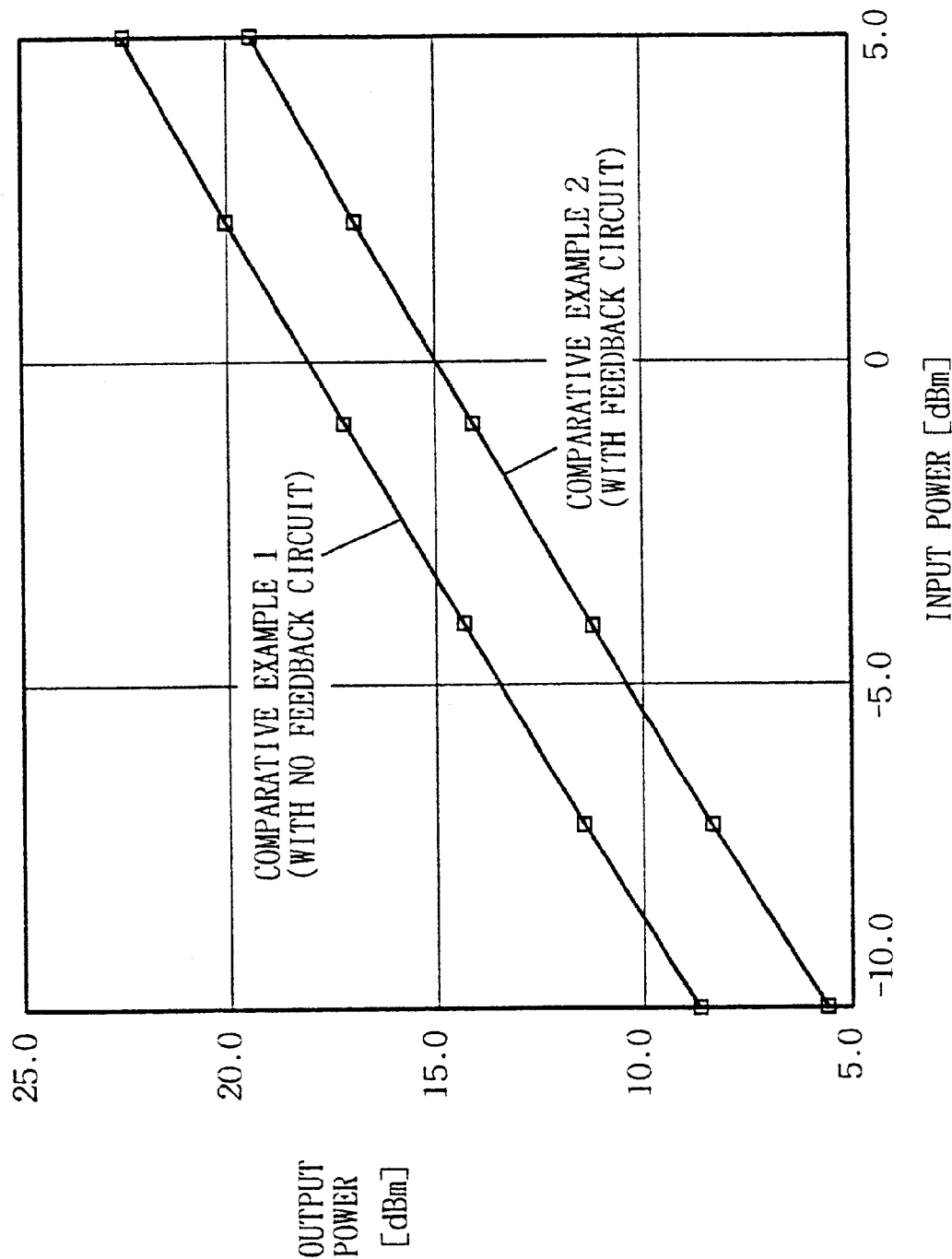
FIG. 11 shows calculation results of input/output power characteristics of the amplifiers according to comparative examples 1 and 2.
Figure 12:
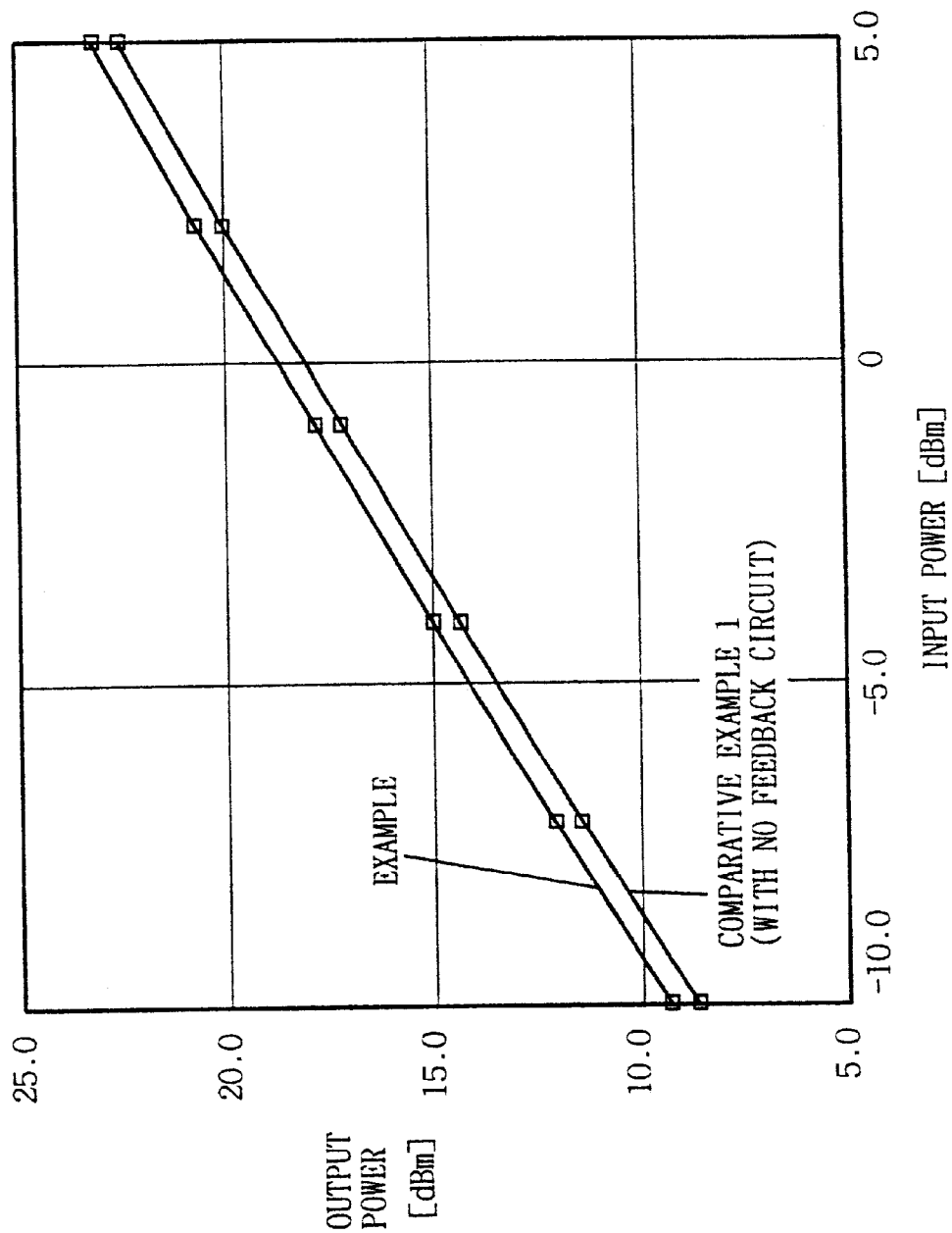
FIG. 12 shows calculation results of input/output power characteristics of the amplifiers according to Example and comparative example 1.

FIG. 12 shows the calculation results of the input/output power characteristics of the amplifiers according to comparative examples 1 and 2 at the frequency of 1.5 GHz. As shown in FIG. 11, the output power was reduced in the amplifier according to comparative example 2 having the RC feedback circuit as compared with that according to comparative example 1 having no feedback circuit, due to the reduction of the gain $S_{21}$ by 3 dB. Namely, it is conceivable that the amplifier according to comparative example 2 is insufficient in performance for serving as a high-output amplifier.

FIG. 12 shows the calculation results of the input/output power characteristics of the amplifiers according to Example and comparative example 1 at the frequency of 1.5 GHz. As shown in FIG. 12, the output power of the amplifier according to Example having the feedback circuit 50 was higher than that of the amplifier according to comparative example 1 having no feedback circuit, due to the improvement of the gain $S_{21}$ by 0.5 dB at the frequency of 1.5 GHz. Namely, the amplifier according to Example is sufficient in performance for serving as a high-output amplifier.

The actual amplifier having no feedback circuit frequently oscillates when the stability factor K is lower than 1.

Consequently, it is understood that all of the stability, the gain and the output power of the amplifier can be improved at a desired frequency by employing the resonance circuit according to the present invention.

When the resonance circuit according to the present invention is employed, further, the amplifier can be formed with a smaller number of elements in a smaller occupied area, and the fabrication steps are simplified.

The resonance circuit 20 according to the present invention can be applied to a bias circuit for an FET as an open stub or a stub of 50 Ω. The conditions for applying the inventive resonance circuit 20 to a bias circuit as an open stub or a stub of 50 Ω were obtained from the following measurement:

In this measurement, an alumina ($Al_2O_3$) substrate having a dielectric constant of 10 and a thickness of 0.635 mm was employed as the dielectric substrate. The width and the characteristic impedance of the microstrip line MSL were 0.55 mm and 50 Ω respectively. The capacitance value of the chip capacitor 4 was 8 pF.

Figure 13:
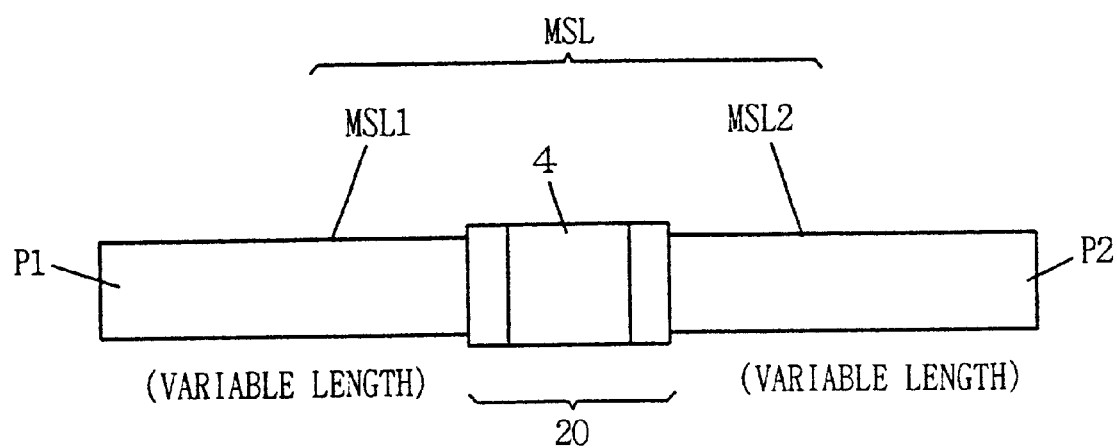
FIG. 13 shows a measuring circuit for measuring conditions in case of applying the resonance circuit as an open stub or a stub of 50 Ω to a bias circuit.

FIG. 13 shows a measuring circuit. Ports P1 and P2 are closer to and opposite to the FET respectively. The lengths of microstrip line parts MSL1 and MSL2 provided between the ports P1 and P2 and the resonance circuit 20 are variable. The evaluation frequency is set at the value of 1.9 GHz for a digital portable telephone.

Figure 14:
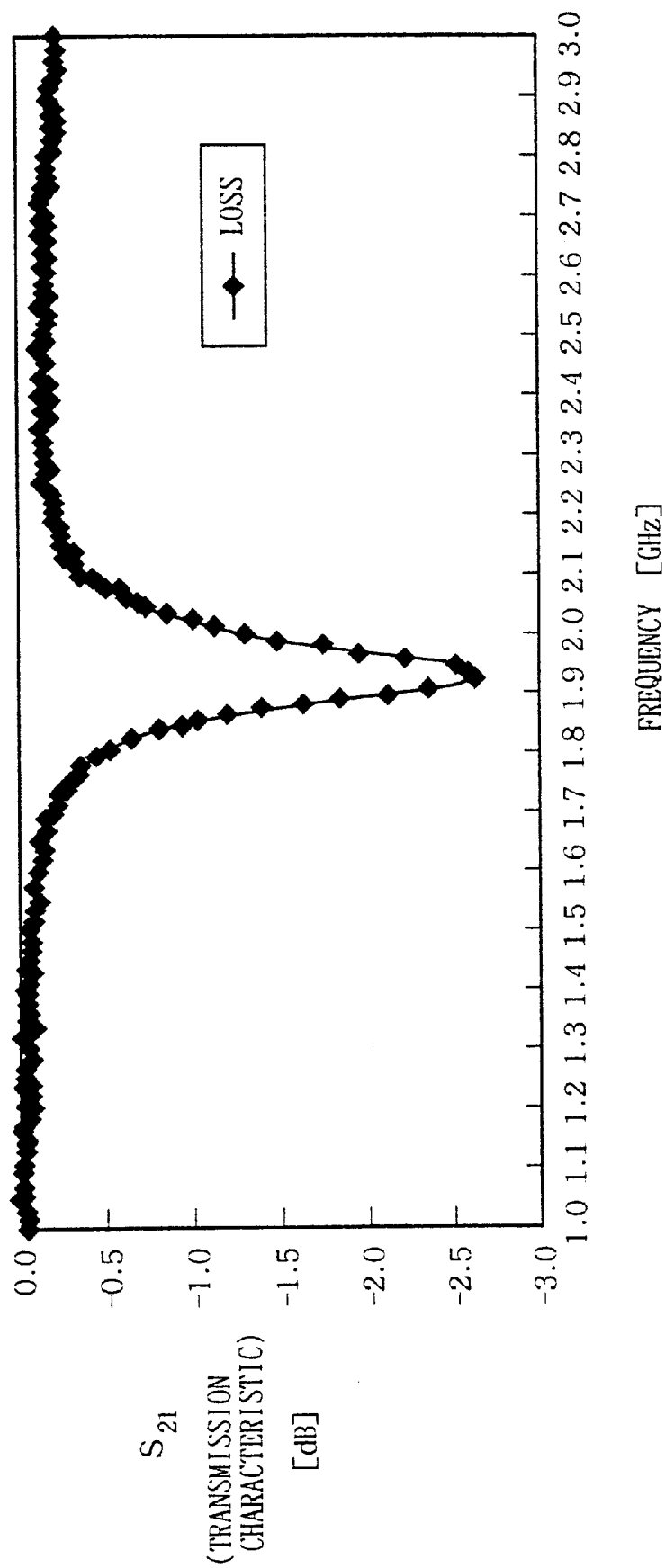
FIG. 14 shows a measurement result of frequency dependence of a transmission characteristic in the measuring circuit shown in FIG. 13.

(1) in the case of employing the resonance circuit as an open stub:

First, frequency dependence of the transmission characteristic $S_{21}$ in the measuring circuit shown in FIG. 13 was measured. In this measurement, the ports P1 and P2 were terminated at 50 Ω. FIG. 14 shows the result of the measurement. It is understood from FIG. 14 that transmission loss resulted from resonance at the frequency of 1.9 GHz.

Figure 15:
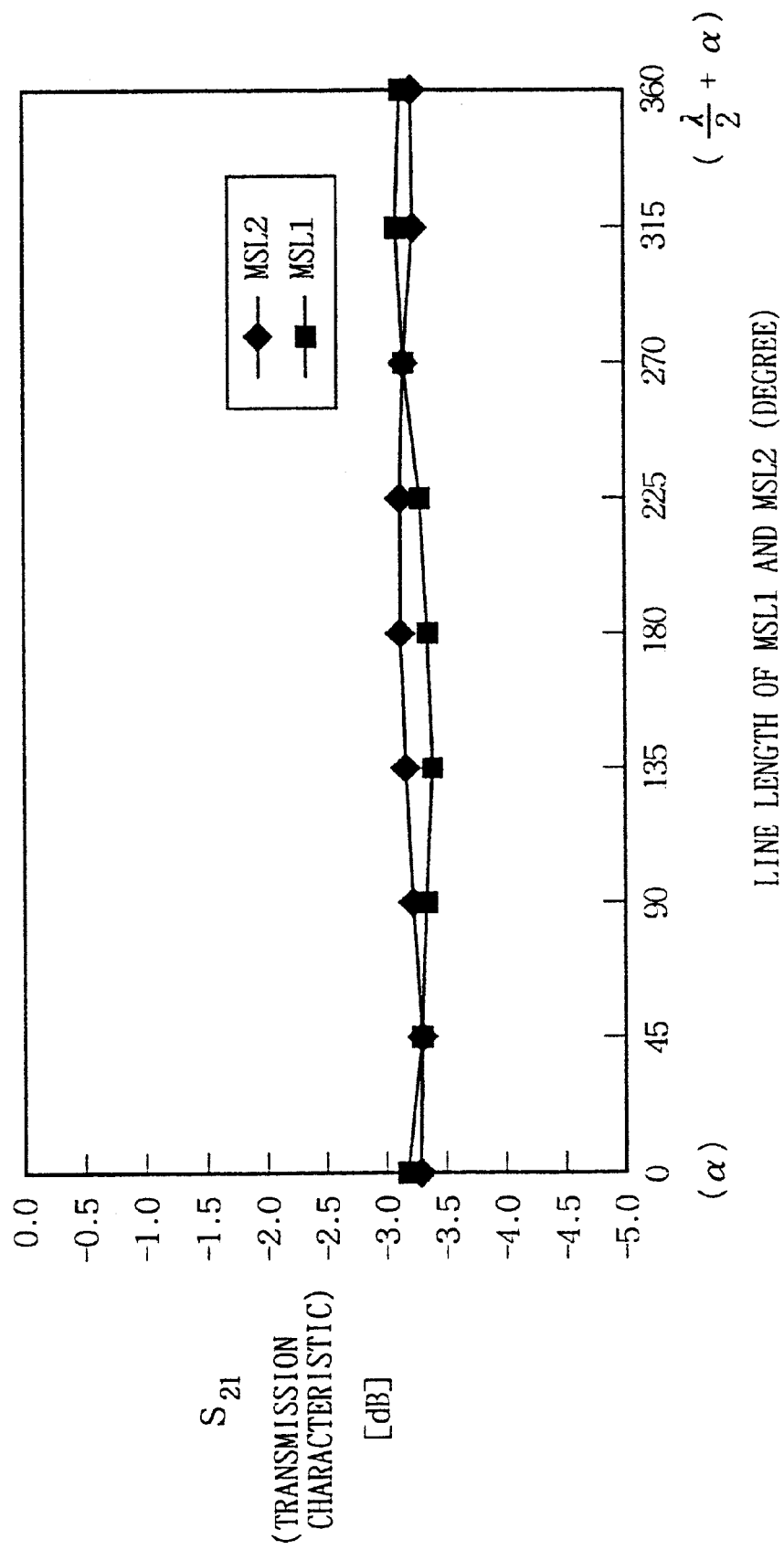
FIG. 15 shows a measurement result of dependence of the transmission characteristic on the line length of a microstrip line in the measuring circuit shown in FIG. 13.

In order to decide the position of the chip capacitor 4, the lengths of the microstrip line parts MSL1 and MSL2 were varied to investigate changes of the transmission characteristic $S_{21}$ at the frequency of 1.9 GHz. FIG. 15 shows the results of the measurement. Referring to FIG. 15, the numbers on the abscissa indicate the lengths of the microstrip line parts MSL1 and MSL2 in electrical lengths, and the parenthesized values indicate the physical lengths. Symbols λ and a denote the wavelength corresponding to the evaluation frequency and a constant respectively.

Referring to FIG. 15, the rhombi and the quadrilaterals show the dependence of the transmission loss on the line lengths of the microstrip line part MSL2 and that of the transmission loss on the line lengths of the microstrip line part MSL1 respectively.

It is understood from FIG. 15 that the transmission loss remains unchanged regardless of the line lengths of the microstrip lines MSL1 and MSL2 which are closer to the ports P1 and P2 respectively. Therefore, the resonance circuit 20 opens at a terminal of the chip capacitor 4 closer to the port P1, regardless of the position of the chip capacitor 4 on the total microstrip line MSL. Further, the resonance circuit 20 opens at the terminal of the chip capacitor 4 closer to the port P2 regardless of the impedance on the port P2 side, whereby an arbitrary position of the microstrip line part MSL2 closer to the port P2 can be grounded.

If the length between the port P1 and the resonance circuit 20 is λ/4, however, the port P1 is shorted to the ground potential since the resonance circuit 20 opens at the terminal closer to the port P1. In this case, the resonance circuit 20 cannot be applied to a bias circuit or a matching circuit of an amplifier. Therefore, the length of the microstrip line part MSL1 closer to the port P1 must be set at a value other than λ/4. In order to increase the transmission loss, a similar resonance circuit may be serially connected to the aforementioned resonance circuit 20.

(2) In the case of employing the resonance circuit 20 as a stub of 50Ω:

When the output impedance is sufficiently lower than 50 Ω as in a high-output amplifier, an effect equivalent to opening is attained even if the impedance of the resonance circuit 20 is 50 Ω. In general, the output impedance of a high-output amplifier is small, about 1/10 as large as 50 Ω, i.e., about 5 Ω or smaller than 5Ω.

Figure 16:
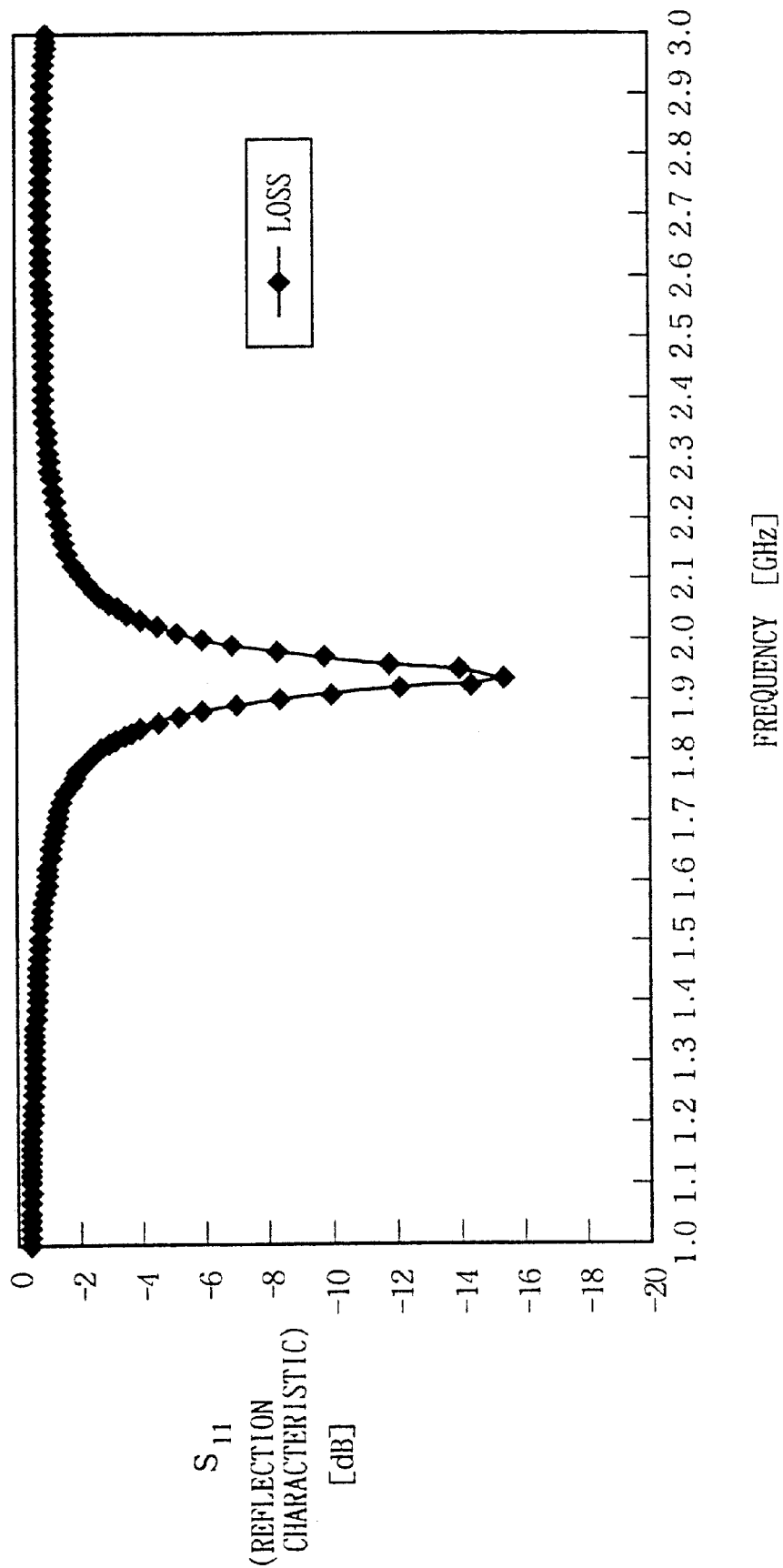
FIG. 16 shows a measurement result of frequency dependence of a reflection characteristic in the measuring circuit shown in FIG. 13.

First, frequency dependence of the reflection characteristic $S_{11}$ in the measuring circuit shown in FIG. 13 was measured. In this measurement, the port P1 was terminated at 50 Ω, while the port P2 was brought into an open state. FIG. 16 shows the result of the measurement.

It is understood from FIG. 16 that reflection loss resulted from resonance at the frequency of 1.9 GHz, to allow no reflection. Namely, the resonance circuit 20 was at 50Ω.

Figure 17:
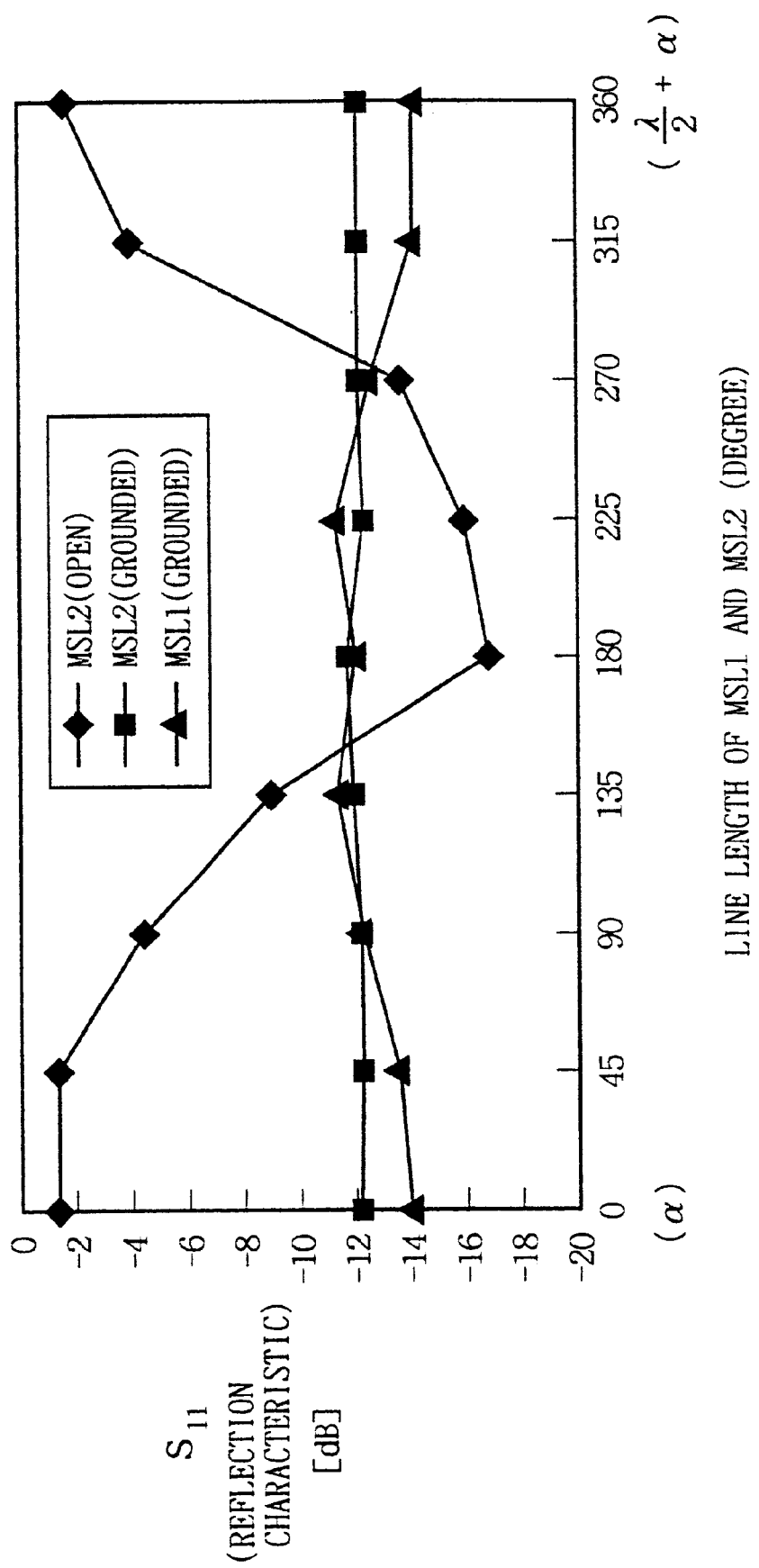
FIG. 17 shows a measurement result of dependence of the reflection characteristic on the line length of the microstrip line in the measuring circuit shown in FIG. 13.

In order to decide the position of the chip capacitor 4, the lengths of the microstrip line parts MSL1 and MSL2 were varied to investigate changes of the reflection characteristic at the frequency of 1.9 GHz. FIG. 17 shows the results of the measurement. Referring to FIG. 17, the numbers on the abscissa indicate the lengths of the microstrip line parts MSL1 and MSL2 in electrical lengths, and the parenthesized values indicate the physical lengths. Symbols λ and α denote the wavelength corresponding to the evaluation frequency and the constant respectively.

Referring to FIG. 17, the rhombi show the dependence of the reflection loss on the line lengths of the microstrip line part MSL2 in an ungrounded (open) state of a terminal of the chip capacitor 4 closer to the port P2, the quadrilaterals show the dependence of the reflection loss on the line lengths of the microstrip line part MSL2 in a grounded state of the terminal of the chip capacitor 4 closer to the port P2, and the triangles show the dependence of the reflection loss on the line lengths of the microstrip line part MSL1 in the grounded state of the terminal of the chip capacitor 4 closer to the port P2 respectively.

It is understood from FIG. 17 that the reflection loss of the resonance circuit 20 remarkably varies with the line lengths of the microstrip line part MSL2 closer to the port P2 when the terminal of the chip capacitor 4 closer to the port P2 is brought into the open state. In other words, the resonant state of the resonance circuit 20 varies with the length of the microstrip line part MSL2 closer to the port P2, and hence the impedance of the resonance circuit 20 as viewed from the port P1 is not univocally settled but varies with the line length of the microstrip line part MSL2 closer to the port P2 among an open state, a shorted state, the value of 50 and other values.

It is understood that the reflection loss of the resonance circuit 20 is independent of the line length of the microstrip line part MSL2 closer to the port P2 when the terminal of the chip capacitor 4 closer to the port P2 is fixed at the ground potential. Namely, the impedance of the resonance circuit 20 as viewed from the port P1, which is based on the terminal of the chip capacitor 4 closer to the port P2, is independent of the line length of the microstrip line part MSL2 closer to the port P2.

It is also understood that the reflection loss of the resonance circuit 20 is also independent of the line length of the microstrip line part MSL1 closer to the port P1 when the terminal of the chip capacitor 4 closer to the port P2 is fixed at the ground potential. Therefore, the chip capacitor 4 can be arranged on an arbitrary position of the total microstrip line MSL.

In case of employing the resonance circuit 20 as an open stub for a bias circuit, therefore, the terminal of the chip capacitor 4 closer to the FET is connected to an arbitrary position excluding that separating from the drain by λ/4 while that opposite to the FET is connected to any arbitrary position.

In case of employing the resonance circuit 20 as a stub of 50 Ω for a bias circuit, on the other hand, the terminal of the chip capacitor 4 closer to the FET is connected to an arbitrary position of the microstrip line MSL, while that opposite to the FET is grounded.

When the terminal of the chip capacitor 4 closer to the port P2 is connected to the ground potential in case of applying the resonance circuit 20 to a bias circuit in practice, no drain bias can be applied to this terminal. Therefore, the terminal of the chip capacitor 4 is grounded through a bypass capacitor of 12 pF.

Figure 18A:
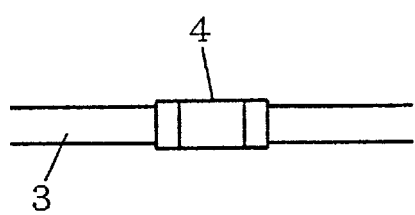
FIG. 18A shows an exemplary chip capacitor forming the resonance circuit provided on a linear portion of a microstrip conductor.
Figure 18B:
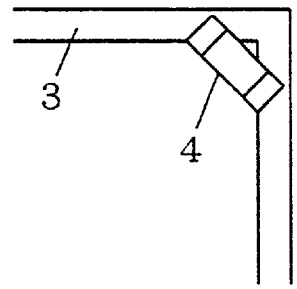
FIG. 18B shows an exemplary chip capacitor forming the resonance circuit provided on a bent portion of the microstrip conductor.

The chip capacitor 4 forming the resonance circuit 4 may be provided on a linear portion or a bent portion of a microstrip conductor 3, as shown in FIG. 18A or 18B.

Figure 19:
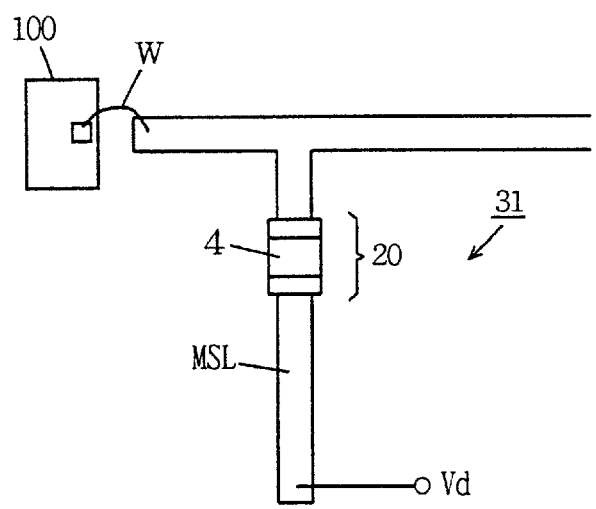
FIG. 19 shows a bias circuit employing the resonance circuit as an open stub.

FIG. 19 shows a bias circuit 31 employing the resonance circuit 20 as an open stub. The drain of an FET 100 is connected to an end of the microstrip line MSL through a bonding wire W. In this bias circuit 31, the chip capacitor 4 is arranged on an arbitrary position excluding that separating from the drain of the FET 100 by λ/4 on the microstrip line MSL. In this case, the value λ/4 must include the length of the bonding wire W in terms of the microstrip line MSL. A drain bias Vd is applied to a portion of the microstrip line MSL opposite to the FET 100. This portion of the microstrip line MSL opposite to the FET 100 may have an arbitrary length.

In this case, the capacitance value of the chip capacitor 4 decides the frequency for bringing the resonance circuit 20 into an open state. The terminal of the chip capacitor 4 opposite to the FET 100 is preferably grounded through a bypass capacitor (not shown), in order to reduce noise. The output impedance depends on the position of the chip capacitor 4 on the microstrip line MSL.

Figure 20:
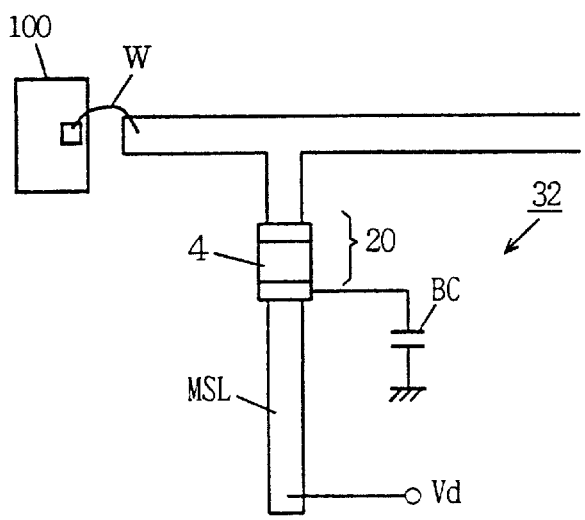
FIG. 20 shows a bias circuit employing the resonance circuit as a stub of 50 Ω.

FIG. 20 shows a bias circuit 32 employing the resonance circuit 20 as a stub of 50 Ω. The drain of an FET 100 is connected to an end of the microstrip line MSL through a bonding wire W. In this bias circuit 32, the chip capacitor 4 is arranged on an arbitrary position of the microstrip line MSL. The terminal of the chip capacitor 4 opposite to the FET 100 is grounded through a bypass capacitor BC. A drain bias Vd is applied to a portion of the microstrip line MSL opposite to the FET 100. The microstrip line MSL has an arbitrary length between the drain of the FET 100 and the chip capacitor 4. The portion of the microstrip line MSL opposite to the FET 100 has an arbitrary length, since the terminal of the chip capacitor 4 opposite to the FET 100 is fixed at the ground potential.

In this case, the capacitance value of the chip capacitor 4 decides the frequency for setting the resonance circuit 20 at 50 Ω. Further, the output impedance depends on the position of the chip capacitor 4 on the microstrip line MSL.

Figure 21:
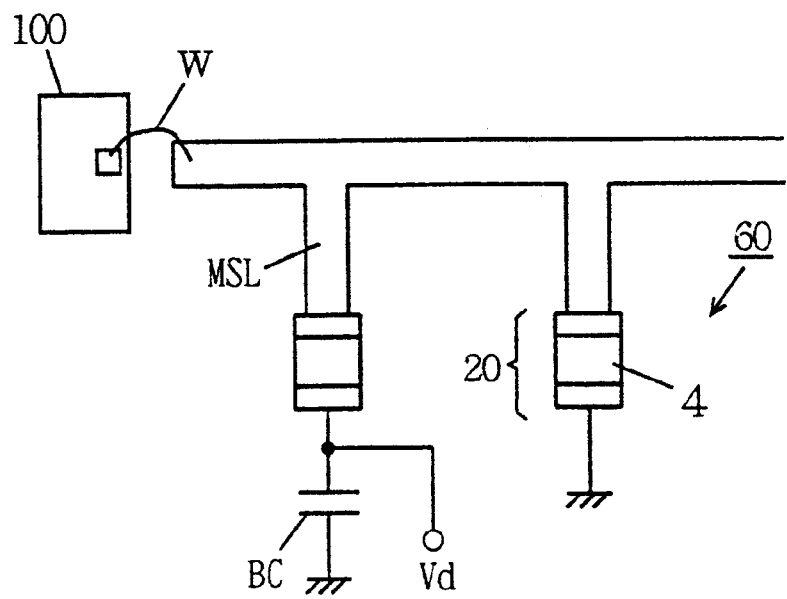
FIG. 21 shows a high-frequency signal processing circuit employing the resonance circuit.

FIG. 21 shows a high-frequency signal processing circuit 60 employing the resonance circuit 20. The high-frequency signal processing circuit 60 shown in FIG. 21 employs the resonance circuit 20 as a stub of 50 Ω. The chip capacitor 4 is arranged on an arbitrary position of the microstrip line MSL. The terminal of the chip capacitor 4 opposite to the FET 100 is grounded. This high-frequency signal processing circuit 60 can terminate an arbitrary frequency at 50 Ω by selecting the capacitance value of the chip capacitor 4. Thus, the high-frequency signal processing circuit 60 can suppress an unnecessary frequency signal such as a second, third or fourth harmonic.

Figure 22:
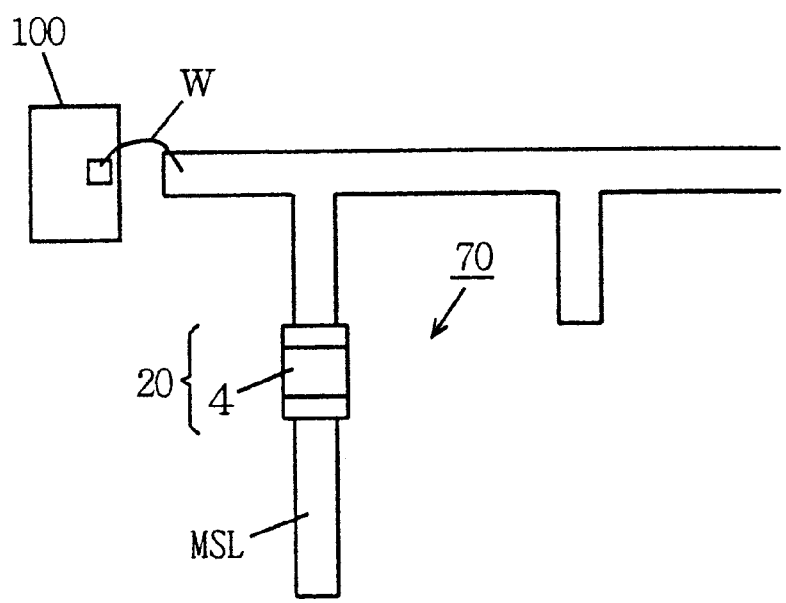
FIG. 22 shows a matching circuit employing the resonance circuit.
Figure 23:
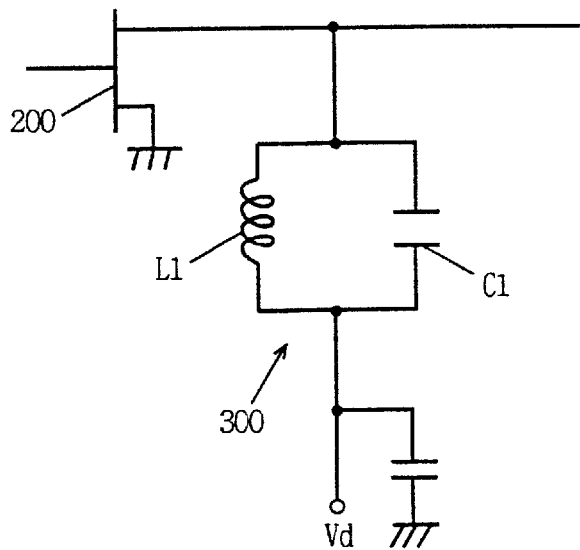
FIG. 23 is a circuit diagram showing an exemplary conventional bias circuit.

FIG. 22 shows a matching circuit 70 employing the resonance circuit 20. The matching circuit 70 shown in FIG. 22 employs the resonance circuit 20 as an open stub. The output impedance can be adjusted by adjusting the position of the chip capacitor 4 on the microstrip line MSL.

While each of the bias circuits 31 and 32, the high-frequency signal processing circuit 60 and the matching circuit 70 employs the chip capacitor 4 as the capacitor, the capacitor may alternatively be formed by the MIM capacitor 8 shown in FIG. 4.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A feedback circuit being provided between an output-side electrode and an input-side electrode of a transistor, comprising:
    a dielectric substrate;
    a microstrip line being provided on said dielectric substrate for feeding back a signal on said output-side electrode of said transistor to said input-side electrode; and
    a capacitor being arranged on top of said microstrip line, said microstrip line being continuous where said capacitor is connected to said microstrip line.

* * * * *